US012425058B2

(12) United States Patent
Uejima et al.

(10) Patent No.: US 12,425,058 B2
(45) Date of Patent: Sep. 23, 2025

(54) RADIO FREQUENCY CIRCUIT AND COMMUNICATION DEVICE

(71) Applicant: Murata Manufacturing Co., Ltd., Kyoto (JP)

(72) Inventors: Takanori Uejima, Kyoto (JP); Kiyoshi Aikawa, Kyoto (JP); Masanari Miura, Kyoto (JP); Hiroyuki Nagamori, Kyoto (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 354 days.

(21) Appl. No.: 18/331,954

(22) Filed: Jun. 9, 2023

(65) Prior Publication Data

US 2023/0318642 A1    Oct. 5, 2023

Related U.S. Application Data

(63) Continuation of application No. PCT/JP2021/040105, filed on Oct. 29, 2021.

(30) Foreign Application Priority Data

Dec. 28, 2020 (JP) ................. 2020-218121

(51) Int. Cl.
H04B 1/04 (2006.01)
H03F 1/56 (2006.01)
H03F 3/24 (2006.01)

(52) U.S. Cl.
CPC ............ H04B 1/0483 (2013.01); H03F 1/56 (2013.01); H03F 3/245 (2013.01); H03F 2200/171 (2013.01); H03F 2200/451 (2013.01)

(58) Field of Classification Search
None
See application file for complete search history.

(56) References Cited

U.S. PATENT DOCUMENTS 10,200,077 B2* 2/2019 Liu .......................... H04B 1/48
2007/0042802 A1* 2/2007 Park ...................... H04B 1/006
455/552.1

(Continued)

FOREIGN PATENT DOCUMENTS

JP    2001-077736 A    3/2001
JP    2012-124911 A    6/2012

(Continued)

OTHER PUBLICATIONS

International Search Report and Written Opinion mailed on Feb. 1, 2022, received for PCT Application PCT/JP2021/040105, filed on Oct. 29, 2021, 8 pages including English Translation.

Primary Examiner — Pablo N Tran
(74) Attorney, Agent, or Firm — XSENSUS LLP

(57) ABSTRACT

A radio frequency circuit includes a transmit filter for B66-Tx connected to a power amplifier, a transmit filter for B25-Tx connected to a power amplifier, a switch circuit having terminals, a switch circuit having a common terminal and terminals, and a switch circuit having a common terminal and terminals. The terminal is connected to the common terminal, the terminal is connected to the common terminal, the terminal is connected to the transmit filter, and the terminal is connected to the transmit filter. The switch circuit has a smaller stack number than the switch circuit, and the switch circuit has a smaller stack number than the switch circuit.

20 Claims, 7 Drawing Sheets

(56) References Cited

U.S. PATENT DOCUMENTS

| | | | |
|---|---|---|---|
| 2013/0122824 A1 | 5/2013 | Schell | |
| 2013/0244722 A1* | 9/2013 | Rousu | H04B 1/0057 455/552.1 |
| 2014/0342678 A1* | 11/2014 | Khlat | H04B 1/44 455/78 |
| 2014/0349592 A1* | 11/2014 | Okazaki | H04B 1/50 455/75 |
| 2015/0133067 A1* | 5/2015 | Chang | H04B 1/006 455/78 |
| 2016/0127015 A1* | 5/2016 | Wloczysiak | H04B 7/08 375/219 |
| 2016/0190995 A1* | 6/2016 | Penticoff | H03F 3/245 330/295 |
| 2016/0211820 A1* | 7/2016 | Bagger | H04B 1/04 |
| 2020/0036401 A1* | 1/2020 | Ella | H04B 1/525 |
| 2020/0412403 A1* | 12/2020 | Pehlke | H04L 5/14 |

FOREIGN PATENT DOCUMENTS

| | | |
|---|---|---|
| WO | 2015/041125 A1 | 3/2015 |
| WO | 2017/145576 A1 | 8/2017 |
| WO | 2020/162072 A1 | 8/2020 |

* cited by examiner

RADIO FREQUENCY CIRCUIT AND COMMUNICATION DEVICE

CROSS-REFERENCE TO RELATED APPLICATIONS

This application is a continuation application of PCT International Application No. PCT/JP2021/040105 filed on Oct. 29, 2021, designating the United States of America, which is based on and claims priority to Japanese Patent Application No. 2020-218121 filed on Dec. 28, 2020. The entire disclosures of the above-identified applications, including the specifications, drawings and claims, are incorporated herein by reference in their entirety.

TECHNICAL FIELD

The present disclosure relates to a radio frequency circuit and a communication device configured to process a radio frequency signal.

BACKGROUND ART

Patent Document 1 discloses a radio frequency module that includes multiple duplexers (transmit/receive filters) connected to a single switch circuit and that enables simultaneous transmission of multiple signals. A phase circuit is disposed between a duplexer and a selection terminal of the switch circuit. This configuration can reduce leakage of a harmonic wave of a transmit signal from one duplexer to another duplexer, namely, from one signal path to another signal path, via the switch circuit.

CITATION LIST

Patent Document

Patent Document 1: International Publication No. 2015/041125

Summary of Disclosure

Technical Problem

The radio frequency module disclosed in Patent Document 1, however, includes a single switch circuit to which all the duplexers configured to simultaneously transmit multiple signals are connected, and thus the number of transmission paths connected to the switch circuit increases, increasing the number of terminals included in the switch circuit. Simultaneous input of multiple transmit signals into a switch circuit increases the voltages applied to the terminals included in the switch circuit, and these increases in voltage generate signal distortion. As the number of terminals included in the switch circuit increases, signal distortion caused by these increases in the voltages applied to the terminals increases, resulting in a decrease in signal quality. In addition, a switch circuit having a high withstand voltage requires a large footprint.

To address these issues, the present disclosure provides a small-sized radio frequency circuit and a small-sized communication device configured to reduce a decrease in transmission performance during simultaneous transmission of multiple signals.

Solution to Problem

A radio frequency circuit according to an embodiment of the present disclosure includes a first power amplifier and a second power amplifier; a first transmit filter that is connected to the first power amplifier and that has a pass band including a first transmit band, the first transmit band being included in a first frequency band; a second transmit filter that is connected to the second power amplifier and that has a pass band including a second transmit band, the second transmit band being included in a second frequency band that does not match the first frequency band; a first switch circuit including a first antenna connection terminal, a second antenna connection terminal, a first terminal, and a second terminal; a second switch circuit including a first common terminal, a third terminal, and a fourth terminal; and a third switch circuit including a second common terminal, a fifth terminal, and a sixth terminal. The first terminal is connected to the first common terminal, the second terminal is connected to the second common terminal, the third terminal is connected to the first transmit filter, and the fifth terminal is connected to the second transmit filter. The first switch circuit includes first switches disposed one each in series between the first antenna connection terminal and the first terminal, between the first antenna connection terminal and the second terminal, between the second antenna connection terminal and the first terminal, and between the second antenna connection terminal and the second terminal, the second switch circuit includes second switches disposed one each in series between the first common terminal and the third terminal and between the first common terminal and the fourth terminal, and the third switch circuit includes third switches disposed one each in series between the second common terminal and the fifth terminal and between the second common terminal and the sixth terminal. Each of the second switches has a smaller stack number than each of the first switches, and each of the third switches has a smaller stack number than each of the first switches.

Advantageous Effects of Disclosure

The present disclosure can provide a small-sized radio frequency circuit and a small-sized communication device configured to reduce a decrease in transmission performance during simultaneous transmission of multiple signals.

DESCRIPTION OF EMBODIMENTS

Figure 1:
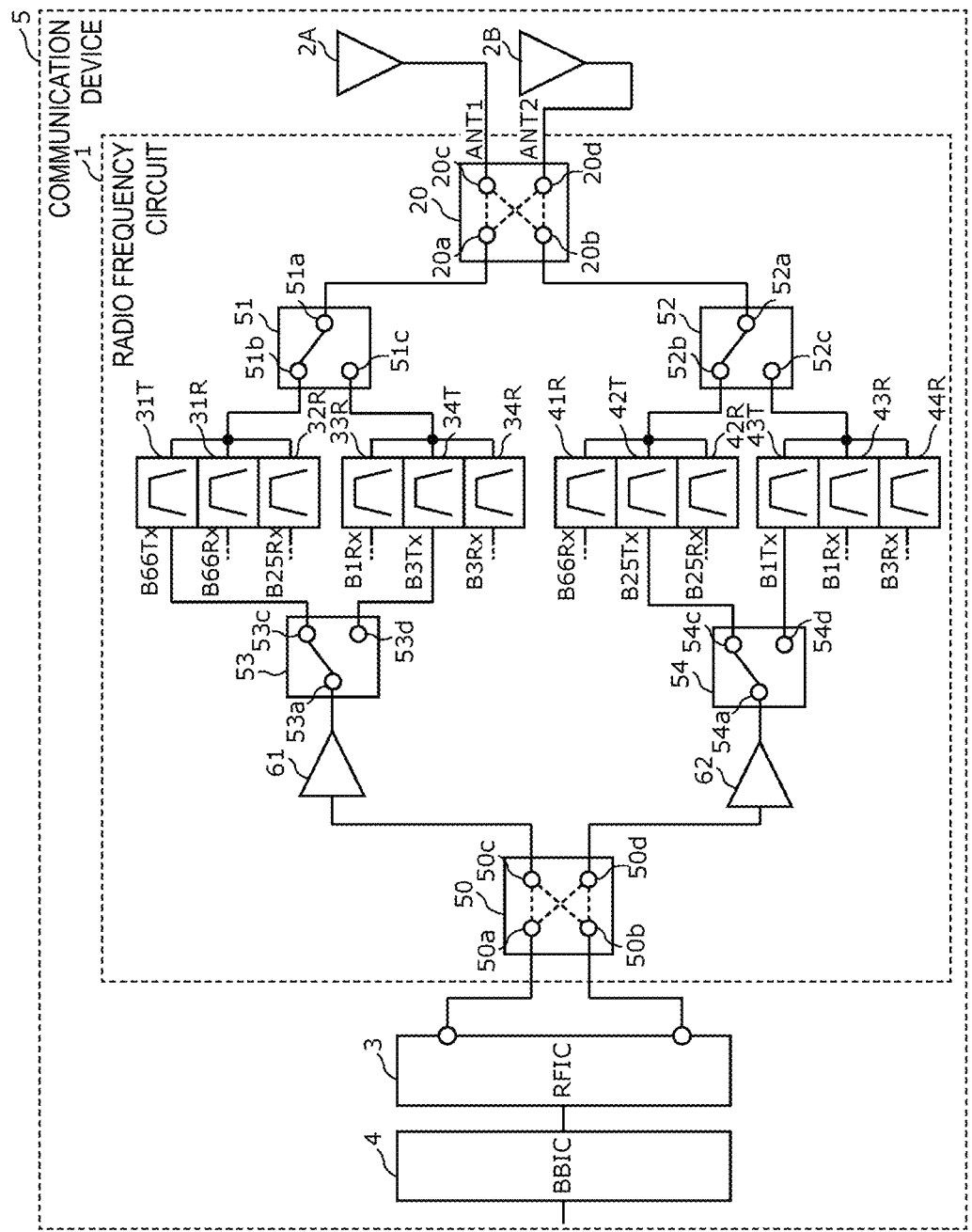
FIG. 1 is a circuit diagram of a radio frequency circuit and a communication device according to an embodiment.

Hereinafter, embodiments of the present disclosure will be described in detail. The embodiments described below each present a comprehensive or specific example. Numerical values, shapes, materials, elements, arrangements of elements, and modes of connecting elements, which are described in the embodiments below, are examples and are not intended to limit the present disclosure. Of the elements in the embodiments and modification below, one or more elements that are not presented in independent claims are described as optional. The sizes of elements and the size ratios of elements illustrated in the drawings are not necessarily precise. Substantially identical configurations are denoted by the same reference sign in the drawings, and duplicate description may be omitted or simplified.

In the following description, a term describing the relationship between elements, such as parallel or perpendicular, a term describing the shape of an element, such as rectangular, and a term describing a numerical range represent not only the literal meaning of the word but also a range regarded as substantially identical to the literal meaning, for example, with a few percent margin.

In the following embodiments, the phrase "A is connected to B" represents not only a state in which A is in contact with B but also a state in which A and B are electrically connected using a conductor electrode, a conductor terminal, wiring, or other circuit components. In addition, the phrase "something is connected between A and B" represents a state in which something is disposed between A and B and connected to both A and B.

In the following description, the term "transmission path" represents a transmission line formed by wiring in which a radio frequency transmit signal propagates, one or more electrodes directly connected to the wiring, one or more terminals directly connected to the wiring or the one or more electrodes, and the like. The term "reception path" represents a transmission line formed by wiring in which a radio frequency receive signal propagates, one or more electrodes directly connected to the wiring, one or more terminals directly connected to the wiring or the one or more electrodes, and the like.

EMBODIMENT

[1. Configurations of Radio Frequency Circuit 1 and Communication Device 5]

FIG. 1 is a circuit diagram of a radio frequency circuit 1 and a communication device 5 according to an embodiment. As illustrated in FIG. 1, the communication device 5 includes the radio frequency circuit 1, antennas 2A and 2B, an RF signal processing circuit (RFIC) 3, and a baseband signal processing circuit (BBIC) 4.

The antenna 2A is, for example, a primary antenna, and the use of the antenna 2A is prioritized over the use of the antenna 2B because of such a parameter as antenna performance. The antenna 2A is an antenna element capable of transmitting and receiving signals in a first frequency band, a second frequency band, a third frequency band, and a fourth frequency band. The antenna 2B is, for example, a secondary antenna and an antenna element capable of transmitting and receiving signals in the first frequency band, the second frequency band, the third frequency band, and the fourth frequency band.

The RFIC 3 is an RF signal processing circuit configured to process a radio frequency signal transmitted or received by the antennas 2A and 2B. Specifically, the RFIC 3 is configured to perform signal processing, such as down-converting, on a receive signal, which is received via the radio frequency circuit 1, and output a receive signal generated by the signal processing to the BBIC 4. The RFIC 3 is also configured to perform signal processing, such as up-converting, on a transmit signal, which is received from the BBIC 4, and output a transmit signal generated by the signal processing to a transmission path of the radio frequency circuit 1.

The BBIC 4 is a circuit configured to perform signal processing in an intermediate frequency band having lower frequencies than a radio frequency signal propagating in the radio frequency circuit 1. A signal processed by the BBIC 4 is used, for example, as an image signal for image display or as an audio signal for voice communication using a loudspeaker.

The RFIC 3 also has a function as a controller configured to, based on a band (frequency band) to be used, control the connections in the switch circuits (described below) included in the radio frequency circuit 1. Specifically, the RFIC 3 is configured to switch between the connections in the switch circuits included in the radio frequency circuit 1 in accordance with a control signal (not depicted). The controller may be disposed outside the RFIC 3 and may be disposed, for example, in the radio frequency circuit 1 or the BBIC 4.

Next, a detailed circuit configuration of the radio frequency circuit 1 will be described.

As illustrated in FIG. 1, the radio frequency circuit 1 includes switch circuits 20, 50, 51, 52, 53, and 54, transmit filters 31T, 34T, 42T, and 43T, receive filters 31R, 32R, 33R, 34R, 41R, 42R, 43R, and 44R, and power amplifiers 61 and 62.

In the present embodiment, each of the four frequency bands is allocated to a specific band, for example, for the long term evolution (LTE) standard or the 5th generation new radio (5G NR) standard. The first frequency band is allocated, for example, to Band 66 (transmit band: 1710 to 1780 MHz, receive band: 2110 to 2200 MHz). The second frequency band is allocated, for example, to Band 25 (transmit band: 1850 to 1915 MHz, receive band: 1930 to 1995 MHz). The third frequency band is allocated, for example, to Band 1 (transmit band: 1920 to 1980 MHz, receive band: 2110 to 2170 MHz). The fourth frequency band is allocated, for example, to Band 3 (transmit band: 1710 to 1785 MHz, receive band: 1805 to 1880 MHz).

The transmit band of Band 3 includes the transmit band of Band 66, and the receive band of Band 66 includes the receive band of Band 1 in the above frequency allocation. The four other frequency bands neither overlap nor include each other.

The radio frequency circuit 1 according to the present embodiment is configured to perform neither two-uplink transmission using Band 66 and Band 3 nor two-downlink transmission using Band 66 and Band 1 in accordance with the above relationship between the frequency bands.

The above configuration enables the radio frequency circuit 1 to perform (1) two-uplink transmission in which a transmit signal in a first transmit band (B66-Tx) included in the first frequency band (Band 66) and a transmit signal in a second transmit band (B25-Tx) included in the second frequency band (Band 25) are simultaneously sent, (2) two-downlink transmission in which a receive signal in a first receive band (B66-Rx) included in the first frequency band (Band 66) and a receive signal in a second receive band (B25-Rx) included in the second frequency band (Band 25) are simultaneously received, (3) two-uplink transmission in which a transmit signal in a third transmit band (B1-Tx) included in the third frequency band (Band 1) and a transmit signal in a fourth transmit band (B3-Tx) included in the fourth frequency band (Band 3) are simultaneously sent, and (4) two-downlink transmission in which a receive signal in a third receive band (B1-Rx) included in the third frequency band (Band 1) and a receive signal in a fourth receive band (B3-Rx) included in the fourth frequency band (Band 3) are simultaneously received.

The transmit filter 31T is an example of a first transmit filter having B66-Tx as the pass band and includes the input terminal connected to the power amplifier 61 with the switch circuit 53 interposed therebetween and the output terminal connected to a terminal 51*b*.

The transmit filter 34T is an example of a fourth transmit filter having B3-Tx as the pass band and includes the input terminal connected to the power amplifier 61 with the switch circuit 53 interposed therebetween and the output terminal connected to a terminal 51*c*.

The receive filter 31R is an example of a first receive filter having B66-Rx as the pass band and includes the input terminal connected to the terminal 51*b*.

The receive filter 32R is an example of a fifth receive filter having B25-Rx as the pass band and includes the input terminal connected to the terminal 51*b*.

The receive filter 33R is an example of a seventh receive filter having B1-Rx as the pass band and includes the input terminal connected to the terminal 51*c*.

The receive filter 34R is an example of a fourth receive filter having B3-Rx as the pass band and includes the input terminal connected to the terminal 51*c*.

The transmit filter 42T is an example of a second transmit filter having B25-Tx as the pass band and includes the input terminal connected to the power amplifier 62 with the switch circuit 54 interposed therebetween and the output terminal connected to a terminal 52*b*.

The transmit filter 43T is an example of a third transmit filter having B1-Tx as the pass band and includes the input terminal connected to the power amplifier 62 with the switch circuit 54 interposed therebetween and the output terminal connected to a terminal 52*c*.

The receive filter 41R is an example of a sixth receive filter having B66-Rx as the pass band and includes the input terminal connected to the terminal 52*b*.

The receive filter 42R is an example of a second receive filter having B25-Rx as the pass band and includes the input terminal connected to the terminal 52*b*.

The receive filter 43R is an example of a third receive filter having B1-Rx as the pass band and includes the input terminal connected to the terminal 52*c*.

The receive filter 44R is an example of an eighth receive filter having B3-Rx as the pass band and includes the input terminal connected to the terminal 52*c*.

The transmit filters 31T and 34T and the receive filters 31R, 32R, 33R, and 34R form a first multiplexer capable of selectively transmitting radio frequency signals in Band 66 and Band 3 and receiving radio frequency signals in Band 66, Band 25, Band 1, and Band 3. The first multiplexer is a group of filters connected between the switch circuit 51 and the power amplifier 61. The first multiplexer includes neither a transmit filter having B25-Tx as the pass band nor a transmit filter having B1-Tx as the pass band.

The transmit filters 42T and 43T and the receive filters 41R, 42R, 43R, and 44R form a second multiplexer capable of selectively transmitting radio frequency signals in Band 25 and Band 1 and receiving radio frequency signals in Band 66, Band 25, Band 1, and Band 3. The second multiplexer is a group of filters connected between the switch circuit 52 and the power amplifier 62. The second multiplexer includes neither a transmit filter having B66-Tx as the pass band nor a transmit filter having B3-Tx as the pass band.

The power amplifier 61 is an example of a first power amplifier and includes the input terminal connected to the switch circuit 50 and the output terminal connected to the switch circuit 53. The power amplifier 62 is an example of a second power amplifier and includes the input terminal connected to the switch circuit 50 and the output terminal connected to the switch circuit 54. The power amplifiers 61 and 62 are formed, for example, by components such as transistors.

The switch circuit 20 is an example of a first switch circuit and includes a terminal 20*a* (first terminal), a terminal 20*b* (second terminal), a terminal 20*c* (first antenna connection terminal), and a terminal 20*d* (second antenna connection terminal).

The terminal 20*c* is connected to the antenna 2A, and the terminal 20*d* is connected to the antenna 2B. The terminal 20*a* is connected to a common terminal 51*a*, and the terminal 20*b* is connected to a common terminal 52*a*.

The switch circuit 20 is configured to exclusively select electrical continuity between the terminal 20*a* and the terminal 20*c* or electrical continuity between the terminal 20*a* and the terminal 20*d* and exclusively select electrical continuity between the terminal 20*b* and the terminal 20*c* or electrical continuity between the terminal 20*b* and the terminal 20*d*.

The switch circuit 20 is, for example, a switch circuit of a double pole double throw (DPDT) type including the terminals 20*a*, 20*b*, 20*c*, and 20*d*. The switch circuit 20 may be a switch circuit such as a double pole 3 throw (DP3T) type or a double pole 4 throw (DP4T) type, and, in such a case, terminals may be used as needed in accordance with the number of bands to be used.

The switch circuit 51 is an example of a second switch circuit and includes the common terminal 51*a* (first common terminal) and the terminals 51*b* (third terminal) and 51*c* (fourth terminal), and the switch circuit 51 is configured to switch between a state in which electrical continuity is provided between the common terminal 51*a* and the terminal 51*b* and a state in which electrical continuity is provided between the common terminal 51*a* and the terminal 51*c*. The common terminal 51*a* is connected to the terminal 20*a*, the terminal 51*b* is connected to the transmit filter 31T and the receive filters 31R and 32R, and the terminal 51*c* is connected to the transmit filter 34T and the receive filters 33R and 34R. This configuration allows the switch circuit 51 to switch between the connection of the transmit filter 31T and the receive filters 31R and 32R to the switch circuit 20 and the connection of the transmit filter 34T and the receive filters 33R and 34R to the switch circuit 20.

The switch circuit 52 is an example of a third switch circuit and includes the common terminal 52*a* (second common terminal) and the terminals 52*b* (fifth terminal) and 52*c* (sixth terminal), and the switch circuit 52 is configured to switch between a state in which electrical continuity is provided between the common terminal 52*a* and the terminal 52*b* and a state in which electrical continuity is provided between the common terminal 52*a* and the terminal 52*c*. The common terminal 52*a* is connected to the terminal 20*b*, the terminal 52*b* is connected to the transmit filter 42T and the receive filters 41R and 42R, and the terminal 52*c* is connected to the transmit filter 43T and the receive filters 43R and 44R. This configuration allows the switch circuit 52 to switch between the connection of the transmit filter 42T and the receive filters 41R and 42R to the switch circuit 20 and the connection of the transmit filter 43T and the receive filters 43R and 44R to the switch circuit 20.

The switch circuits 51 and 52 are, for example, switches of a single pole double throw (SPDT) type.

The switch circuit 53 includes a common terminal 53a and terminals 53c and 53d and is configured to switch between a state in which electrical continuity is provided between the common terminal 53a and the terminal 53c and a state in which electrical continuity is provided between the common terminal 53a and the terminal 53d. The common terminal 53a is connected to the power amplifier 61, the terminal 53c is connected to the transmit filter 31T, and the terminal 53d is connected to the transmit filter 34T. This configuration allows the switch circuit 53 to switch between the connection of the transmit filter 31T to the power amplifier 61 and the connection of the transmit filter 34T to the power amplifier 61.

The switch circuit 54 includes a common terminal 54a and terminals 54c and 54d and is configured to switch between a state in which electrical continuity is provided between the common terminal 54a and the terminal 54c and a state in which electrical continuity is provided between the common terminal 54a and the terminal 54d. The common terminal 54a is connected to the power amplifier 62, the terminal 54c is connected to the transmit filter 42T, and the terminal 54d is connected to the transmit filter 43T. This configuration allows the switch circuit 54 to switch between the connection of the transmit filter 42T to the power amplifier 62 and the connection of the transmit filter 43T to the power amplifier 62.

The switch circuit 50 includes a terminal 50a, a terminal 50b, a terminal 50c, and a terminal 50d.

The terminal 50c is connected to the power amplifier 61, and the terminal 50d is connected to the power amplifier 62. The terminals 50a and 50b are each connected to a corresponding terminal of the RFIC 3.

The switch circuit 50 is configured to exclusively select electrical continuity between the terminal 50a and the terminal 50c or electrical continuity between the terminal 50a and the terminal 50d and exclusively select electrical continuity between the terminal 50b and the terminal 50c or electrical continuity between the terminal 50b and the terminal 50d.

The switch circuit 50 is, for example, a switch circuit of a DPDT type. The switch circuit 50 may be a switch circuit of a DP3T type or of a DP4T type, and, in such a case, terminals may be used as needed in accordance with the number of bands to be used.

An impedance matching circuit may be disposed between the above circuit components forming the radio frequency circuit 1.

The above configuration enables the radio frequency circuit 1 to freely allocate radio frequency signals in Band 66, Band 25, Band 1, and Band 3 to the antennas 2A and 2B by switching between the states in which the switch circuits 20 and 50 to 54 are connected, and the radio frequency circuit 1 is capable of the two-uplink transmission and the two-downlink transmission, which are each simultaneous transmission as described above in (1) to (4). Although the first multiplexer includes neither a transmit filter for Band 25 nor a transmit filter for Band 1 and the second multiplexer includes neither a transmit filter for Band 66 nor a transmit filter for Band 3, the radio frequency circuit 1, which is small-sized and is capable of the two-uplink transmission and the two-downlink transmission, which are each simultaneous transmission, is provided.

Of the circuit components illustrated in FIG. 1, the radio frequency circuit according to the present disclosure at least includes the power amplifiers 61 and 62, the transmit filters 31T and 43T, and the switch circuits 20, 51, and 52.

[2. Configurations of Switch Circuits According to Embodiment]

Next, description will be given with regard to the circuit configurations of the switch circuits 20, 51, and 52 forming the radio frequency circuit 1.

Figure 2A:
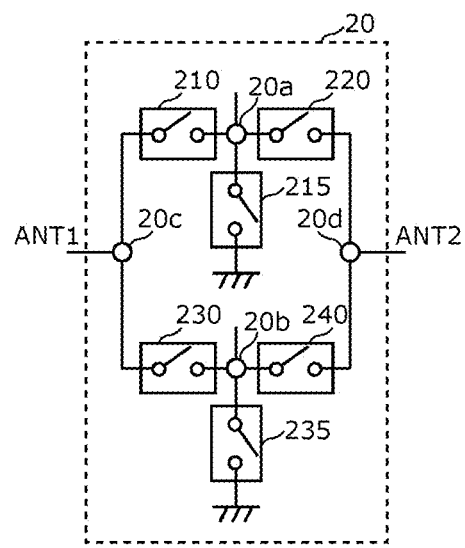
FIG. 2A is a circuit diagram of a first switch circuit according to the embodiment.

FIG. 2A is a circuit diagram of the switch circuit 20 according to the embodiment. As illustrated in FIG. 2A, the switch circuit 20 includes switches 210, 220, 230, 240, 215, and 235 in addition to the terminals 20a, 20b, 20c, and 20d.

The switch 210 is an example of a first switch and what is called a series switch, which is disposed in series between the terminal 20c and the terminal 20a. The switch 220 is an example of the first switch and what is called a series switch, which is disposed in series between the terminal 20d and the terminal 20a. The switch 230 is an example of the first switch and what is called a series switch, which is disposed in series between the terminal 20c and the terminal 20b. The switch 240 is an example of the first switch and what is called a series switch, which is disposed in series between the terminal 20d and the terminal 20b.

The phrase "a switch is disposed in series between a terminal a and a terminal b" represents a state in which a switch configured to select connection or disconnection between two terminals is connected to a terminal a at one of the two terminals and connected to a terminal b at the other of the two terminals.

The switch 215 is an example of a fourth switch and what is called a shunt switch, which is connected between the terminal 20a and the ground. The switch 235 is an example of the fourth switch and what is called a shunt switch, which is connected between the terminal 20b and the ground.

The first switches and the fourth switches forming the switch circuit 20 are each formed by one or more semiconductor elements connected in series. The one or more semiconductor elements are each, for example, a field effect transistor (FET) formed by the source electrode, the drain electrode, and the gate electrode. The stack number is defined as the number of semiconductor elements connected in series in each of the first and fourth switches.

The switches 215 and 235 are optional.

Figure 2B:
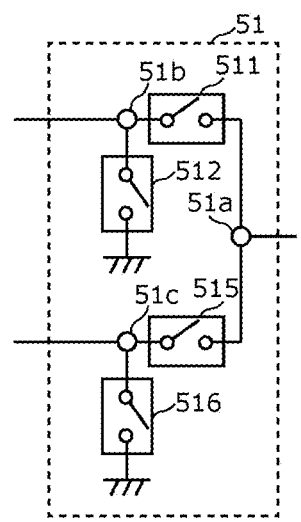
FIG. 2B is a circuit diagram of a second switch circuit according to the embodiment.

FIG. 2B is a circuit diagram of the switch circuit 51 according to the embodiment. As illustrated in FIG. 2B, the switch circuit 51 includes switches 511, 515, 512, and 516 in addition to the common terminal 51a and the terminals 51b and 51c.

The switch 511 is an example of a second switch and what is called a series switch, which is disposed in series between the common terminal 51a and the terminal 51b. The switch 515 is an example of the second switch and what is called a series switch, which is disposed in series between the common terminal 51a and the terminal 51c.

The switch 512 is an example of a fifth switch and what is called a shunt switch, which is connected between the terminal 51b and the ground. The switch 516 is an example of the fifth switch and what is called a shunt switch, which is connected between the terminal 51c and the ground.

The second switches and the fifth switches forming the switch circuit 51 are each formed by one or more semiconductor elements connected in series. The one or more semiconductor elements are each, for example, an FET formed by the source electrode, the drain electrode, and the gate electrode. The stack number is defined as the number of semiconductor elements connected in series in each of the second and fifth switches.

The switches 512 and 516 are optional.

Figure 2C:
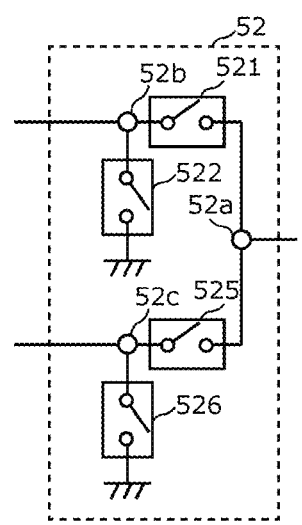
FIG. 2C is a circuit diagram of a third switch circuit according to the embodiment.

FIG. 2C is a circuit diagram of the switch circuit 52 according to the embodiment. As illustrated in FIG. 2C, the switch circuit 52 includes switches 521, 525, 522, and 526 in addition to the common terminal 52*a* and the terminals 52*b* and 52*c*.

The switch 521 is an example of a third switch and what is called a series switch, which is disposed in series between the common terminal 52*a* and the terminal 52*b*. The switch 525 is an example of the third switch and what is called a series switch, which is disposed in series between the common terminal 52*a* and the terminal 52*c*.

The switch 522 is an example of a sixth switch and what is called a shunt switch, which is connected between the terminal 52*b* and the ground. The switch 526 is an example of the sixth switch and what is called a shunt switch, which is connected between the terminal 52*c* and the ground.

The third switches and the sixth switches forming the switch circuit 52 are each formed by one or more semiconductor elements connected in series. The one or more semiconductor elements are each, for example, an FET formed by the source electrode, the drain electrode, and the gate electrode. The stack number is defined as the number of semiconductor elements connected in series in each of the third and sixth switches.

The switches 522 and 526 are optional.

Figure 3:
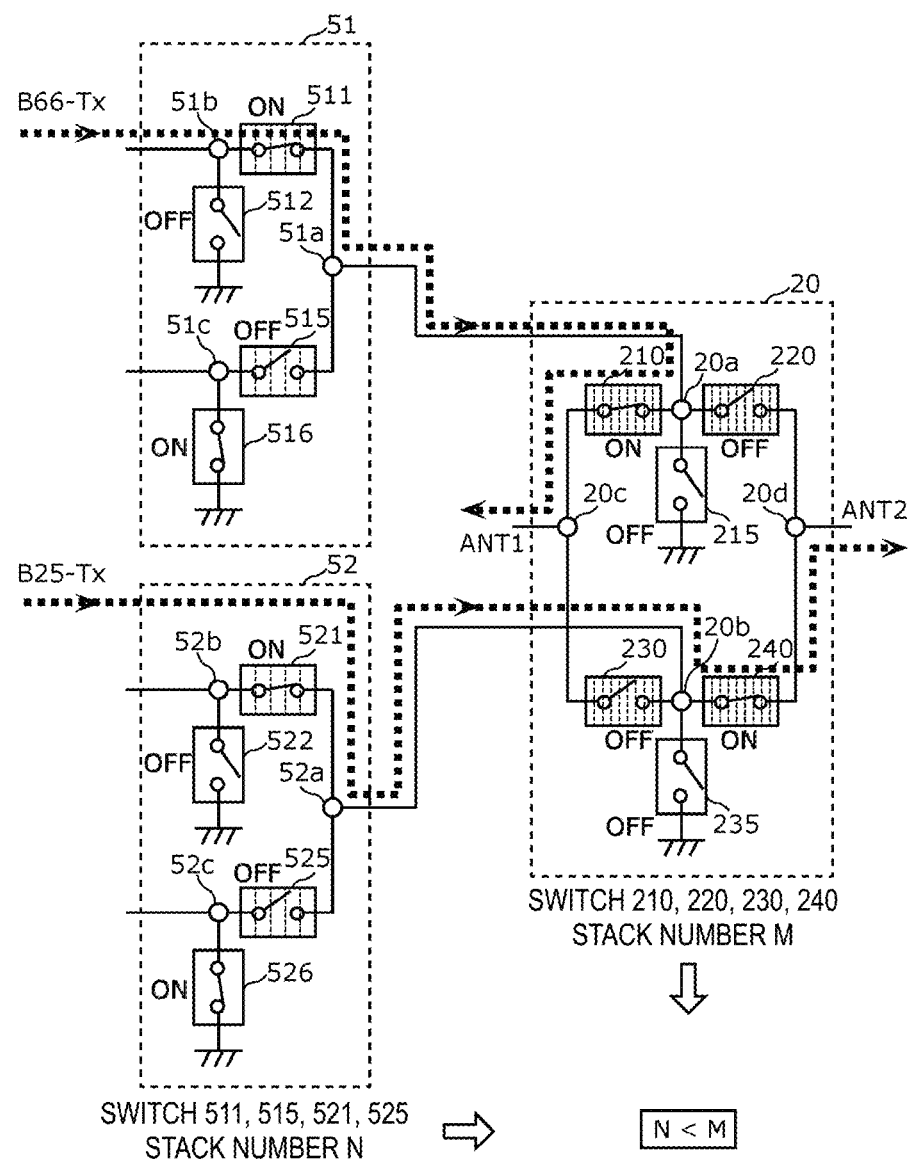
FIG. 3 illustrates a state of the switch circuits in the radio frequency circuit according to the embodiment during two-uplink transmission.

FIG. 3 illustrates a state of the switch circuits 20, 51, and 52 in the radio frequency circuit 1 according to the embodiment during two-uplink transmission. FIG. 3 illustrates a state of the circuits performing two-uplink transmission in which a transmit signal in the first transmit band (B66-Tx) included in the first frequency band (Band 66) and a transmit signal in the second transmit band (B25-Tx) included in the second frequency band (Band 25) are simultaneously transmitted.

As illustrated in FIG. 3, the transmit signal in B66-Tx is output to the antenna 2A via the terminal 51*b*, the switch 511, the common terminal 51*a*, the terminal 20*a*, the switch 210, and the terminal 20*c*. The transmit signal in B25-Tx is simultaneously output to the antenna 2B via the terminal 52*b*, the switch 521, the common terminal 52*a*, the terminal 20*b*, the switch 240, and the terminal 20*d*.

Each of the switch circuits 51 and 52 only passes a single corresponding transmit signal in this process. In contrast, the switch circuit 20 simultaneously passes two transmit signals. When a switch circuit passes a transmit signal, a switch that is open to cut off the transmit signal needs to withstand a voltage in accordance with the transmission power of the transmit signal.

For example, the switch 515, which is open in the switch circuit 51, needs to withstand a voltage in accordance with the transmission power of the transmit signal in B66-Tx. Further, for example, the switch 525, which is open in the switch circuit 52, needs to withstand a voltage in accordance with the transmission power of the transmit signal in B25-Tx.

In contrast, for example, the switch 220, which is open in the switch circuit 20, needs to withstand a voltage produced by the transmit signal in B66-Tx, which is applied to the terminal 20*a*, and a voltage produced by the transmit signal in B25-Tx, which is applied to the terminal 20*d*.

Further, for example, the switch 230, which is open in the switch circuit 20, needs to withstand a voltage produced by the transmit signal in B66-Tx, which is applied to the terminal 20*c*, and a voltage produced by the transmit signal in B25-Tx, which is applied to the terminal 20*b*.

In summary, the second switches, which are series switches forming the switch circuit 51, and the third switches, which are series switches forming the switch circuit 52 may withstand a lower voltage than the first switches, which are series switches forming the switch circuit 20.

The withstand voltage of a switch increases with the stack number of the switch, which is the number of semiconductor elements forming the switch.

Thus, the stack number (for example, N) of each of the second switches forming the switch circuit 51 is smaller than the stack number (for example, M) of each of the first switches forming the switch circuit 20, and the stack number (for example, N) of each of the third switches forming the switch circuit 52 is smaller than the stack number (for example, M) of each of the first switches forming the switch circuit 20.

[3. Configurations of Radio Frequency Circuit and Switch Circuits According to Comparative Example]

Next, description will be given with regard to the circuit configurations of a radio frequency circuit 900 and a switch circuit 90 according to a comparative example.

Figure 4:
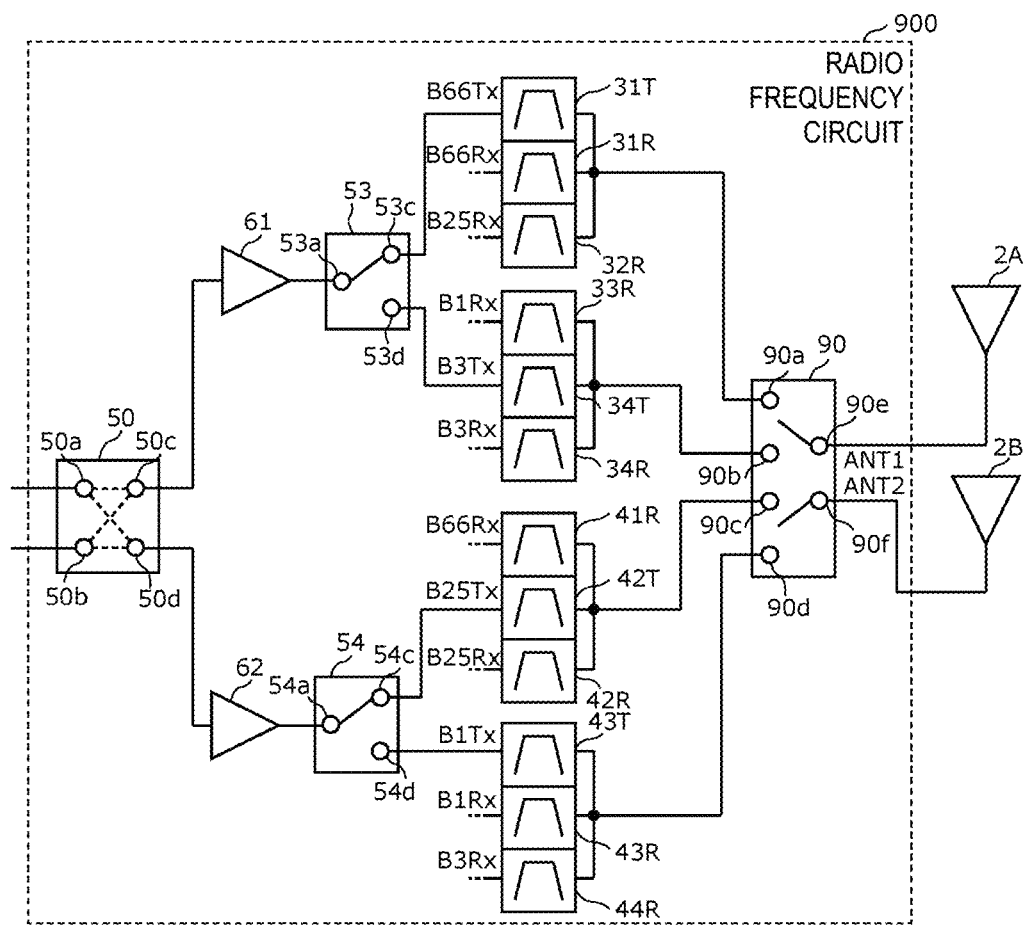
FIG. 4 is a circuit diagram of a radio frequency circuit according to a comparative example.

FIG. 4 is a circuit diagram of the radio frequency circuit 900 according to the comparative example. As illustrated in FIG. 4, the radio frequency circuit 900 includes switch circuits 90, 50, 53, and 54, transmit filters 31T, 34T, 42T, and 43T, receive filters 31R, 32R, 33R, 34R, 41R, 42R, 43R, and 44R, and power amplifiers 61 and 62. The radio frequency circuit 900 according to the comparative example only differs from the radio frequency circuit 1 according to the embodiment in that the switch circuit 90 is disposed instead of the switch circuits 20, 51, and 52.

The following description with regard to the radio frequency circuit 900 according to the comparative example will focus on the configurations that differ from the configurations of the radio frequency circuit 1 according to the embodiment, and the same or similar configurations will not be described.

The switch circuit 90 includes terminals 90*a*, 90*b*, 90*c*, 90*d*, 90*e*, and 90*f*.

The terminal 90*e* is connected to the antenna 2A, and the terminal 90*f* is connected to the antenna 2B. The terminal 90*a* is connected to the transmit filter 31T and the receive filters 31R and 32R, the terminal 90*b* is connected to the transmit filter 34T and the receive filters 33R and 34R, the terminal 90*c* is connected to the transmit filter 42T and the receive filters 41R and 42R, and the terminal 90*d* is connected to the transmit filter 43T and the receive filters 43R and 44R.

The switch circuit 90 is configured to exclusively select electrical continuity between the terminal 90*e* and the terminal 90*a*, electrical continuity between the terminal 90*e* and the terminal 90*b*, electrical continuity between the terminal 90*e* and the terminal 90*c*, or electrical continuity between the terminal 90*e* and the terminal 90*d* and exclusively select electrical continuity between the terminal 90*f* and the terminal 90*a*, electrical continuity between the terminal 90*f* and the terminal 90*b*, electrical continuity between the terminal 90*f* and the terminal 90*c*, or electrical continuity between the terminal 90*f* and the terminal 90*d*.

The above configuration enables the radio frequency circuit 900 to freely allocate radio frequency signals in Band 66, Band 25, Band 1, and Band 3 to the antennas 2A and 2B by switching between the states in which the switch circuits 90, 50, 53, and 54 are connected, and the radio frequency circuit 900 can perform the two-uplink transmission and the two-downlink transmission, which are each simultaneous transmission as described above in (1) to (4).

Figure 5:
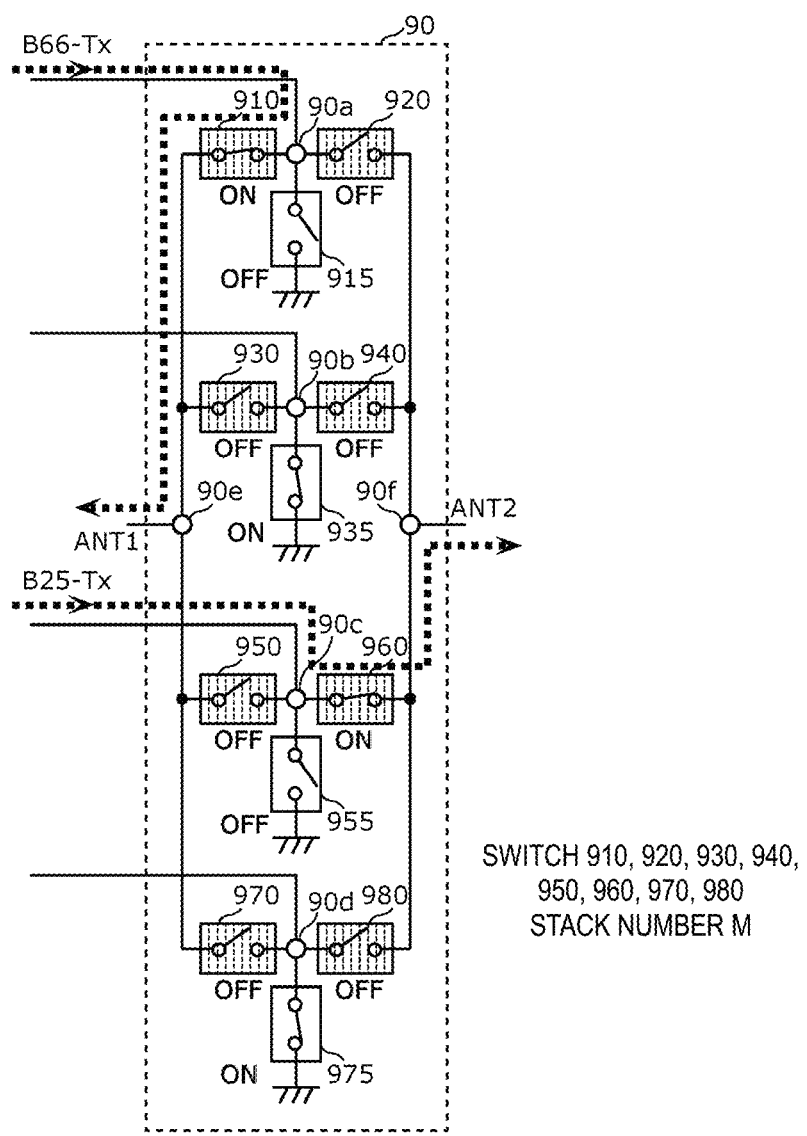
FIG. 5 illustrates a state of the switch circuits in the radio frequency circuit according to the comparative example during two-uplink transmission.

FIG. 5 illustrates a state of the switch circuit 90 in the radio frequency circuit 900 according to the comparative example during two-uplink transmission. As illustrated in FIG. 5, the switch circuit 90 includes switches 910, 920, 930, 940, 950, 960, 970, 980, 915, 935, 955, and 975 in addition to the terminals 90a, 90b, 90c, 90d, 90e, and 90f.

The switch 910 is what is called a series switch, which is disposed in series between the terminal 90e and the terminal 90a. The switch 920 is what is called a series switch, which is disposed in series between the terminal 90f and the terminal 90a. The switch 930 is what is called a series switch, which is disposed in series between the terminal 90e and the terminal 90b. The switch 940 is what is called a series switch, which is disposed in series between the terminal 90f and the terminal 90b. The switch 950 is what is called a series switch, which is disposed in series between the terminal 90e and the terminal 90c. The switch 960 is what is called a series switch, which is disposed in series between the terminal 90f and the terminal 90c. The switch 970 is what is called a series switch, which is disposed in series between the terminal 90e and the terminal 90d. The switch 980 is what is called a series switch, which is disposed in series between the terminal 90f and the terminal 90d.

The switch 915 is what is called a shunt switch, which is connected between the terminal 90a and the ground. The switch 935 is what is called a shunt switch, which is connected between the terminal 90b and the ground. The switch 955 is what is called a shunt switch, which is connected between the terminal 90c and the ground. The switch 975 is what is called a shunt switch, which is connected between the terminal 90d and the ground.

Switches forming the switch circuit 90 are each formed by one or more semiconductor elements connected in series. The one or more semiconductor elements are each, for example, an FET formed by the source electrode, the drain electrode, and the gate electrode.

FIG. 5 illustrates a state of the circuit performing two-uplink transmission in which a transmit signal in the first transmit band (B66-Tx) included in the first frequency band (Band 66) and a transmit signal in the second transmit band (B25-Tx) included in the second frequency band (Band 25) are simultaneously transmitted.

As illustrated in FIG. 5, the transmit signal in B66-Tx is output to the antenna 2A via the terminal 90a, the switch 910, and the terminal 90e. The transmit signal in B25-Tx is simultaneously output to the antenna 2B via the terminal 90c, the switch 960, and the terminal 90f.

The switch circuit 90 simultaneously passes the two transmit signals in this process. When a switch circuit passes a transmit signal, a switch that is open to cut off the transmit signal needs to withstand a voltage in accordance with the transmission power of the transmit signal.

For example, the switch 920, which is open in the switch circuit 90, needs to withstand a voltage produced by the transmit signal in B66-Tx, which is applied to the terminal 90a, and a voltage produced by the transmit signal in B25-Tx, which is applied to the terminal 90f.

Further, for example, the switch 950, which is open in the switch circuit 90, needs to withstand a voltage produced by the transmit signal in B66-Tx, which is applied to the terminal 90e, and a voltage produced by the transmit signal in B25-Tx, which is applied to the terminal 90c.

Further, when a transmit signal in B66Tx is output from the antenna 2B and a transmit signal in B25Tx is output from the antenna 2A, the switches 910 and 960, which are open, each need to withstand a voltage produced by the transmit signal in B66-Tx and a voltage produced by the transmit signal in B25-Tx.

Similarly, when a transmit signal in the third transmit band (B1-Tx) included in the third frequency band (Band 1) and a transmit signal in the fourth transmit band (B3-Tx) included in the fourth frequency band (Band 3) are simultaneously transmitted during two-uplink transmission, the switches 940 and 970, which are open, each need to withstand a voltage produced by the transmit signal in B1-Tx and a voltage produced by the transmit signal in B3-Tx. Further, the switches 930 and 980, which are open, each need to withstand a voltage produced by the transmit signal in B1-Tx and a voltage produced by the transmit signal in B3-Tx.

[4. Comparison Between Configurations of Switch Circuits According to Embodiment and Comparative Example]

In short, series switches forming the switch circuit 90 need to withstand a voltage approximately equal to the voltage for the first switches forming the switch circuit 20.

Consequently, the stack number (for example, M) of each of the switches forming the switch circuit 90 is set to a value that is approximately equal to the stack number (for example, M) of each of the first switches forming the switch circuit 20, that is larger than the stack number (for example, N) of each of the second switches forming the switch circuit 51, and that is larger than the stack number (for example, N) of each of the third switches forming the switch circuit 52.

In the radio frequency circuit 900 according to the comparative example, two transmit filters for two-uplink transmission are directly connected to a single switch circuit, which is the switch circuit 90, and thus, the number of transmission paths connected to the switch circuit 90 increases, increasing the number of terminals included in the switch circuit 90. An increase in the number of terminals included in the switch circuit 90 leads to an increase in the off capacitance of the switch circuit 90, and the increase in the off capacitance causes an increase in the transmission loss in the switch circuit 90. In addition, simultaneous input of multiple transmit signals into the switch circuit 90 increases the voltages applied to the switches forming the switch circuit 90, and these increases in voltage lead to more signal distortion, resulting in a decrease in signal quality. The signal distortion increases with the number of terminals included in the switch circuit 90. If the stack number is increased to improve the withstand voltage performance of the switches forming the switch circuit 90 to cope with these issues, the footprint of the switch circuit 90 increases, resulting in a larger footprint of the radio frequency circuit 900.

In contrast, in the radio frequency circuit 1 according to the embodiment, the two transmit filters for two-uplink transmission are individually connected to the switch circuits 51 and 52, and thus, transmission paths are connected one each to the switch circuits 51 and 52. Consequently, the switch circuits 51 and 52 each include fewer terminals than the switch circuit 90. Although two transmission paths are connected to the switch circuit 20, the number of terminals included in the switch circuit 20 is smaller than the number of terminals included in the switch circuit 90 because the switch circuits 51 and 52 are disposed. Thus, because the switch circuits 51, 52, and 20 each include fewer terminals than the switch circuit 90, the switch circuits 51, 52, and 20 each have less off capacitance. Consequently, the transmission loss of a signal caused by the off capacitance is reduced. Simultaneous input of multiple transmit signals into the switch circuit 20 increases the voltages applied to the switches forming the switch circuit 20, and these increases in voltage generate signal distortion. But the switch circuit 20 includes fewer terminals than the switch circuit 90, leading to less signal distortion in the switch circuit 20 than in the switch circuit 90. Although each of the switches forming the switch circuit 20 has a stack number approximately equal to the stack number of each of the switches included in the switch circuit 90, each of the switches forming the switch circuits 51 and 52 has a smaller stack number than each of the switches forming the switch circuit 90. This configuration enables the switch circuits in the radio frequency circuit 1 according to the embodiment to have a smaller footprint than the switch circuits in the radio frequency circuit 900 according to the comparative example. Thus, it is possible to provide the radio frequency circuit 1, which is a small-sized radio frequency circuit configured to reduce a decrease in transmission performance during two-uplink transmission.

[5. Configurations of Radio Frequency Circuit 1A According to Modification]

Figure 6:
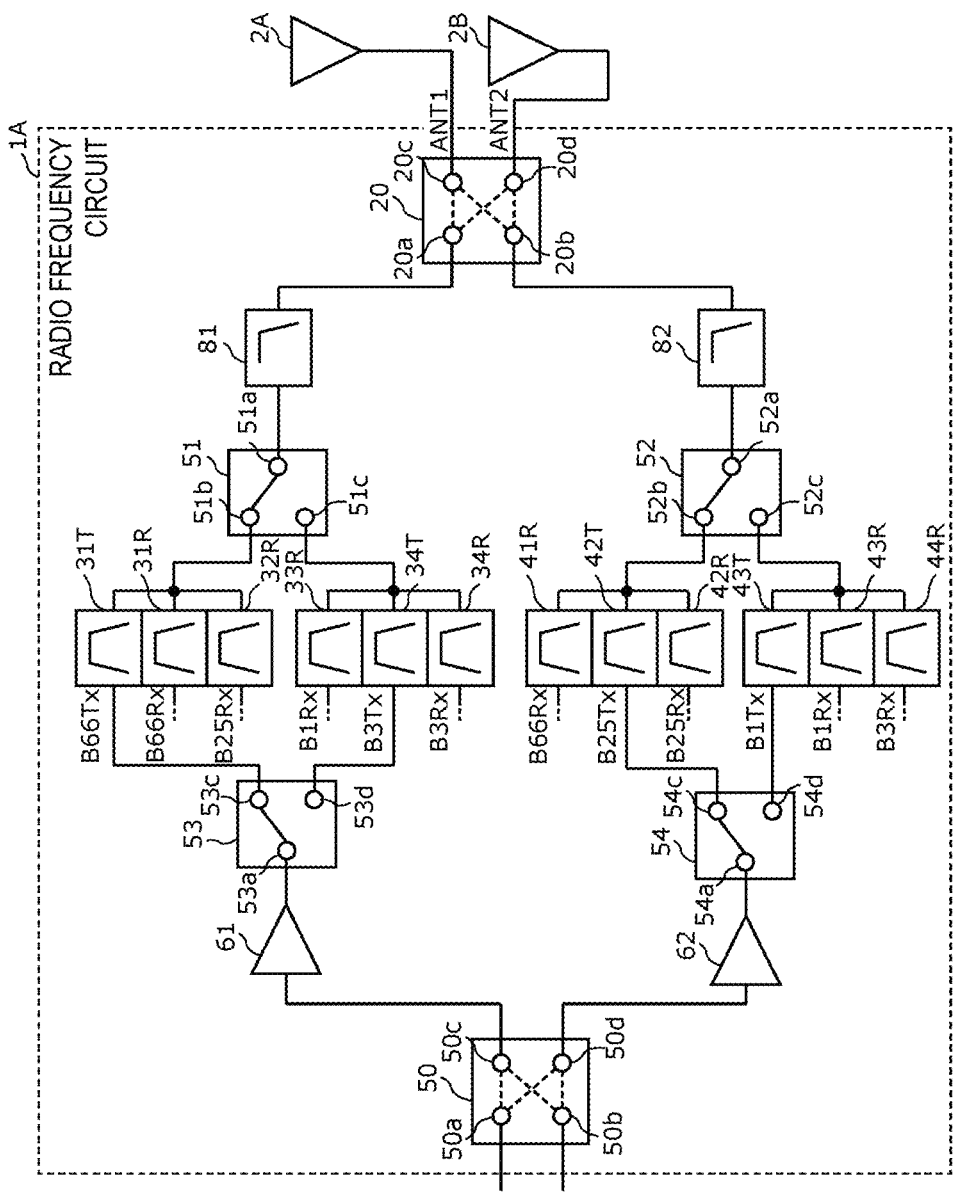
FIG. 6 is a circuit diagram of a radio frequency circuit according to a modification to the embodiment.

FIG. 6 is a circuit diagram of a radio frequency circuit 1A according to a modification to the embodiment. As illustrated in FIG. 6, the radio frequency circuit 1A includes switch circuits 20, 50, 51, 52, 53, and 54, transmit filters 31T, 34T, 42T, and 43T, receive filters 31R, 32R, 33R, 34R, 41R, 42R, 43R, and 44R, power amplifiers 61 and 62, and low pass filters 81 and 82. The radio frequency circuit 1A according to the present modification only differs from the radio frequency circuit 1 according to the embodiment in that the low pass filters 81 and 82 are disposed.

The following description with regard to the radio frequency circuit 1A according to the present modification will focus on the configurations that differ from the configurations of the radio frequency circuit 1 according to the embodiment, and the same or similar configurations will not be described.

The low pass filter 81 is an example of a first filter circuit and is connected between the switch circuit 20 and the switch circuit 51. The low pass filter 81 has, for example, a pass band including the first frequency band (Band 66), the second frequency band (Band 25), the third frequency band (Band 1), and the fourth frequency band (Band 3) and has an attenuation band including a second harmonic of the first frequency band (Band 66) and a second harmonic of the fourth frequency band (Band 3). This configuration can reduce generation of harmonic waves in the power amplifier 61 and the transmit filters 31T and 34T.

The low pass filter 82 is an example of a second filter circuit and is connected between the switch circuit 20 and the switch circuit 52. The low pass filter 82 has, for example, a pass band including the third frequency band (Band 66), the second frequency band (Band 25), the third frequency band (Band 1), and the fourth frequency band (Band 3) and has an attenuation band including a second harmonic of the second frequency band (Band 25) and a second harmonic of the third frequency band (Band 1). This configuration can reduce generation of harmonic waves in the power amplifier 62 and the transmit filters 42T and 43T.

With regard to the radio frequency circuit 1A, a frequency range of intermodulation distortion (first intermodulation distortion) may at least partially overlap the first frequency band, the first intermodulation distortion being caused by a second harmonic wave of a transmit signal in the first transmit band included in the first frequency band and a fundamental wave of a transmit signal in the second transmit band included in the second frequency band. Alternatively, a frequency range of intermodulation distortion (second intermodulation distortion) may at least partially overlap the second frequency band, the second intermodulation distortion being caused by a fundamental wave of a transmit signal in the first transmit band included in the first frequency band and a second harmonic wave of a transmit signal in the second transmit band included in the second frequency band.

In such a case, the low pass filter 81, which is disposed between the switch circuit 20 and the switch circuit 51, can reduce the first intermodulation distortion entering the switch circuit 51 from the switch circuit 20. Further, the low pass filter 82, which is disposed between the switch circuit 20 and the switch circuit 52, can reduce the second intermodulation distortion entering the switch circuit 52 from the switch circuit 20. Thus, a decrease in the quality of a transmit signal can be reduced.

For example, if the first frequency band is Band 3 and the second frequency band is Band 1, the first intermodulation distortion at least partially overlaps Band 1.

Further, for example, if the first frequency band is Band 1 and the second frequency band is Band 3, the second intermodulation distortion at least partially overlaps Band 3.

Further, for example, if the first frequency band is Band 40 (frequency range: 2300 to 2400 MHz) and the second frequency band is Band 1, the first intermodulation distortion at least partially overlaps Band 40.

In such cases, the low pass filter 81 can reduce the first intermodulation distortion entering the switch circuit 51 from the switch circuit 20. Further, the low pass filter 82 can reduce the second intermodulation distortion entering the switch circuit 52 from the switch circuit 20. Thus, a decrease in the quality of a transmit signal can be reduced.

The low pass filters 81 and 82 may be replaced by high pass filters or notch filters.

The low pass filter 81 may also be replaced by a first matching circuit to match impedance. The low pass filter 82 may also be replaced by a second matching circuit to match impedance. Preferably, the first matching circuit and the second matching circuit each include an inductor. The switch circuits 20, 51, and 52 tend to have capacitive impedance because of terminals that do not provide electrical continuity. In contrast, because the first matching circuit, which is disposed between the switch circuit 20 and the switch circuit 51, and the second matching circuit, which is disposed between the switch circuit 20 and the switch circuit 52, have inductive impedance, the impedance matching between the switch circuits is efficiently achieved, leading to reduction in transmission loss in the radio frequency circuit 1A.

As the gate width of a semiconductor element (FET) that forms each switch increases, the ON resistance, which is the resistance that appears while the switch is closed, decreases without any effect on the withstand voltage performance. Thus, a large gate width may be adopted for the semiconductor elements (FET) that form the first switches in the switch circuit 20. In this way, the ON resistance can be decreased while the withstand voltage performance of the switch circuit 20 is maintained.

[6. Advantageous Effects and Others]

As described above, the radio frequency circuit 1 according to the present embodiment includes the power amplifiers 61 and 62; the transmit filter 31T that is connected to the power amplifier 61 and that has a pass band including the first transmit band (B66-Tx), the first transmit band being included in the first frequency band (Band 66); the transmit filter 42T that is connected to the power amplifier 62 and that has a pass band including the second transmit band (B25-Tx), the second transmit band being included in the second frequency band (Band 25); the switch circuit 20 including the terminals 20c, 20d, 20a, and 20b, the switch circuit 20 switching between a state in which electrical continuity is provided between the terminal 20a and the terminal 20c and a state in which electrical continuity is provided between the terminal 20a and the terminal 20d and switching between a state in which electrical continuity is provided between the terminal 20b and the terminal 20c and a state in which electrical continuity is provided between the terminal 20b and the terminal 20d; the switch circuit 51 including the common terminal 51a and the terminals 51b and 51c, the switch circuit 51 switching between a state in which electrical continuity is provided between the common terminal 51a and the terminal 51b and a state in which electrical continuity is provided between the common terminal 51a and the terminal 51c; and the switch circuit 52 including the common terminal 52a and the terminals 52b and 52c, the switch circuit 52 switching between a state in which electrical continuity is provided between the common terminal 52a and the terminal 52b and a state in which electrical continuity is provided between the common terminal 52a and the terminal 52c. The terminal 20a is connected to the common terminal 51a, the terminal 20b is connected to the common terminal 52a, the terminal 51b is connected to the transmit filter 31T, and the terminal 52b is connected to the transmit filter 42T. The switch circuit 20 includes the first switches disposed one each in series between the terminal 20c and the terminal 20a, between the terminal 20c and the terminal 20b, between the terminal 20d and the terminal 20a, and between the terminal 20d and the terminal 20b. The switch circuit 51 includes the second switches disposed one each in series between the common terminal 51a and the terminal 51b and between the common terminal 51a and the terminal 51c. The switch circuit 52 includes the third switches disposed one each in series between the common terminal 52a and the terminal 52b and between the common terminal 52a and the terminal 52c. Each of the second switches has a smaller stack number than each of the first switches, and each of the third switches has a smaller stack number than each of the first switches.

In this configuration, because the two transmit filters 31T and 42T are connected to the switch circuits 51 and 52, respectively, transmission paths are connected one each to the switch circuits 51 and 52. Thus, the switch circuits 51 and 52 each include fewer terminals. Although two transmission paths are connected to the switch circuit 20, the switch circuit 20 includes fewer terminals because the switch circuits 51 and 52 are disposed. Thus, because the switch circuits 51, 52, and 20 each include fewer terminals, the switch circuits 51, 52, and 20 each have less off capacitance. Consequently, the transmission loss of a signal caused by the off capacitance is reduced. Simultaneous input of multiple transmit signals into the switch circuit 20 increases the voltages applied to the switches forming the switch circuit 20, and these increases in voltage generate signal distortion. But the switch circuit 20 includes fewer terminals, leading to less signal distortion. Although each of the first switches forming the switch circuit 20 has a stack number approximately equal to the stack number for a switch circuit known in the art, each of the switches forming the switch circuits 51 and 52 has a smaller stack number than each of the switches forming a switch circuit known in the art. In this way, the switch circuits in the radio frequency circuit 1 can be downsized. Thus, it is possible to provide the radio frequency circuit 1, which is a small-sized radio frequency circuit configured to reduce a decrease in transmission performance during simultaneous transmission of multiple signals.

In the radio frequency circuit 1, the switch circuit 20 may include the fourth switches connected one each between the terminal 20c and the ground, between the terminal 20d and the ground, between the terminal 20a and the ground, and between the terminal 20b and the ground; the switch circuit 51 may include fifth switches connected one each between the common terminal 51a and the ground, between the terminal 51b and the ground, and between the terminal 51c and the ground; and the switch circuit 52 may include sixth switches connected one each between the common terminal 52a and the ground, between the terminal 52b and the ground, and between the terminal 52c and the ground.

It is possible to improve isolation between the terminals included in the switch circuits 20, 51, and 52 in these configurations.

In the radio frequency circuit 1, the switch circuit 20 may be configured to switch between a state in which electrical continuity is provided between the terminal 20a and the terminal 20c and a state in which electrical continuity is provided between the terminal 20a and the terminal 20d and may be configured to switch between a state in which electrical continuity is provided between the terminal 20b and the terminal 20c and a state in which electrical continuity is provided between the terminal 20b and the terminal 20d, the switch circuit 51 may be configured to switch between a state in which electrical continuity is provided between the common terminal 51a and the terminal 51b and a state in which electrical continuity is provided between the common terminal 51a and the terminal 51c, and the switch circuit 52 may be configured to switch between a state in which electrical continuity is provided between the common terminal 52a and the terminal 52b and a state in which electrical continuity is provided between the common terminal 52a and the terminal 52c.

The radio frequency circuit 1A may further include the first matching circuit connected between the switch circuit 20 and the switch circuit 51 and a second matching circuit connected between the switch circuit 20 and the switch circuit 52, and the first matching circuit and the second matching circuit may each include an inductor.

The switch circuits 20, 51, and 52 tend to have capacitive impedance because of terminals that do not provide electrical continuity. In contrast, the first matching circuit and the second matching circuit have inductive impedance, and the impedance matching between the switch circuits is efficiently achieved, leading to reduction in transmission loss in the radio frequency circuit 1A.

The radio frequency circuit 1A may further include the low pass filter 81 connected between the switch circuit 20 and the switch circuit 51 and the low pass filter 82 connected between the switch circuit 20 and the switch circuit 52.

These configurations enable the low pass filter 81 to reduce generation of harmonic waves in the power amplifier 61 and the transmit filters 31T and 34T and enable the low pass filter 82 to reduce generation of harmonic waves in the power amplifier 62 and the transmit filters 42T and 43T.

With regard to the radio frequency circuit 1A, a frequency range of intermodulation distortion (first intermodulation distortion) may at least partially overlap the first frequency band, the first intermodulation distortion being caused by a second harmonic wave of a transmit signal in the first transmit band included in the first frequency band and a fundamental wave of a transmit signal in the second transmit band included in the second frequency band. Alternatively, a frequency range of intermodulation distortion (second intermodulation distortion) may at least partially overlap the second frequency band, the second intermodulation distortion being caused by a fundamental wave of a transmit signal in the first transmit band included in the first frequency band and a second harmonic wave of a transmit signal in the second transmit band included in the second frequency band.

These configurations enable the low pass filter 81, which is disposed between the switch circuit 20 and the switch circuit 51, to reduce the first intermodulation distortion entering the switch circuit 51 from the switch circuit 20. Further, these configurations also enable the low pass filter 82, which is disposed between the switch circuit 20 and the switch circuit 52, to reduce the second intermodulation distortion entering the switch circuit 52 from the switch circuit 20. Thus, a decrease in the quality of a transmit signal can be reduced.

If the radio frequency circuit 1A has Band 3 as the first frequency band and Band 1 as the second frequency band, the first intermodulation distortion may at least partially overlap Band 1.

Further, if the radio frequency circuit 1A has Band 1 as the first frequency band and Band 3 as the second frequency band, the second intermodulation distortion may at least partially overlap Band 3 in the radio frequency circuit 1A.

Further, if the radio frequency circuit 1A has Band 40 as the first frequency band and Band 1 as the second frequency band, the first intermodulation distortion may at least partially overlap Band 40.

In such cases, the low pass filter 81 can reduce the first intermodulation distortion entering the switch circuit 51 from the switch circuit 20. Further, the low pass filter 82 can reduce the second intermodulation distortion entering the switch circuit 52 from the switch circuit 20. Thus, a decrease in the quality of a transmit signal can be reduced.

The radio frequency circuit 1 may further include the transmit filter 34T that is connected to the power amplifier 61 and that has a pass band including the fourth transmit band (B3-Tx), the fourth transmit band being included in the fourth frequency band (Band 3); and the transmit filter 43T that is connected to the power amplifier 62 and that has a pass band including the third transmit band (B1-Tx), the third transmit band being included in the third frequency band (Band 1). The terminal 51c may be connected to the transmit filter 34T, the terminal 52c may be connected to the transmit filter 43T, neither a transmit filter having a pass band including the second transmit band nor a transmit filter having a pass band including the third transmit band needs to be disposed between the power amplifier 61 and the switch circuit 51, and neither a transmit filter having a pass band including the first transmit band nor a transmit filter having a pass band including the fourth transmit band needs to be disposed between the power amplifier 62 and the switch circuit 52. Two-uplink transmission of sending a transmit signal in the first transmit band and a transmit signal in the second transmit band may be performed through electrical continuity between the common terminal 51a and the terminal 51b and electrical continuity between the common terminal 52a and the terminal 52b, and two-uplink transmission of sending a transmit signal in the third transmit band and a transmit signal in the fourth transmit band may be performed through electrical continuity between the common terminal 51a and the terminal 51c and electrical continuity between the common terminal 52a and the terminal 52c.

In these configurations, switching between the states in which the switch circuits 20, 51 and 52 are connected enables radio frequency signals in the first frequency band (Band 66), the second frequency band (Band 25), the third frequency band (Band 1), and the fourth frequency band (Band 3) to be freely allocated to the antennas 2A and 2B, and two-uplink transmission, which is simultaneous transmission, can be performed. The radio frequency circuit 1, which is a small-sized radio frequency circuit capable of simultaneously transmitting multiple signals, can be provided because neither a transmit filter having a pass band including the second transmit band nor a transmit filter having a pass band including the third transmit band is disposed between the power amplifier 61 and the switch circuit 51 and neither a transmit filter having a pass band including the first transmit band nor a transmit filter having a pass band including the fourth transmit band is disposed between the power amplifier 62 and the switch circuit 52.

The communication device 5 includes the radio frequency circuit 1 and the RFIC 3 configured to process a radio frequency signal transmitted or received using the radio frequency circuit 1.

This configuration can provide the communication device 5, which is a small-sized communication device configured to reduce a decrease in transmission performance during simultaneous transmission of multiple signals.

OTHER EMBODIMENTS

The radio frequency circuit and the communication device according to the embodiment have been described above based on the embodiment and its modification, but the radio frequency circuit and the communication device according to the present disclosure are not limited to those described in the above embodiment and its modification. The present disclosure also includes other embodiments achievable by combinations of any elements in the above embodiment and its modification, modifications obtained by those skilled in the art who performs various conceivable variations on the above embodiment and its modification within the scope of the present disclosure, and various apparatuses that include the radio frequency circuit and the communication device disclosed herein.

In the above embodiment and its modification, the description has been given, as an example, with regard to the two-uplink transmission, in which a radio frequency signal in the first frequency band and a radio frequency signal in the second frequency band are simultaneously transmitted, and the two-uplink transmission, in which a radio frequency signal in the third frequency band and a radio frequency signal in the fourth frequency band are simultaneously transmitted, but the configurations of the radio frequency circuit and the communication device according to the present disclosure may be applied to uplink transmission in which three or more different frequency bands are simultaneously used (for example, three-uplink transmission). In summary, the term "two-uplink transmission" as used in the above embodiment and its modification includes multiple-uplink transmission, in which three or more different frequency bands are simultaneously used, and the present disclosure also includes a radio frequency circuit or a communication device that is configured to perform uplink transmission in which three or more different frequency bands are simultaneously used and that includes the configurations of the radio frequency circuit or the communication device according to the above embodiment and its modification.

For example, components such as other radio frequency circuit elements and wiring may be inserted between the paths connecting circuit elements and signal paths disclosed in the drawings in the radio frequency circuit and the communication device according to the above embodiment and its modification.

INDUSTRIAL APPLICABILITY

The present disclosure may widely be applied to communication apparatuses such as mobile phones as a front-end circuit capable of two-uplink transmission and compatible with multiband/multimode transmission.

REFERENCE SIGNS LIST 1, 1A, 900 radio frequency circuit
2A, 2B antenna
3 RF signal processing circuit (RFIC)
4 baseband signal processing circuit (BBIC)
5 communication device
20, 50, 51, 52, 53, 54, 90 switch circuit
20a, 20b, 20c, 20d, 50a, 50b, 50c, 50d, 51b, 51c, 52b, 52c, 53c, 53d, 54c, 54d, 90a, 90b, 90c, 90d, 90e, 90f terminal
51a, 52a, 53a, 54a common terminal
31R, 32R, 33R, 34R, 41R, 42R, 43R, 44R receive filter
31T, 34T, 42T, 43T transmit filter
61, 62 power amplifier
81, 82 low pass filter
210, 215, 220, 230, 235, 240, 511, 512, 515, 516, 521, 522, 525, 526, 910, 915, 920, 930, 935, 940, 950, 955, 960, 970, 975, 980 switch

The invention claimed is:

1. A radio frequency circuit comprising:
a first power amplifier and a second power amplifier;
a first transmit filter that is connected to the first power amplifier and that has a pass band including a first transmit band, the first transmit band being included in a first frequency band;
a second transmit filter that is connected to the second power amplifier and that has a pass band including a second transmit band, the second transmit band being included in a second frequency band that does not match the first frequency band;
a first switch circuit including a first antenna connection terminal, a second antenna connection terminal, a first terminal, and a second terminal;
a second switch circuit including a first common terminal, a third terminal, and a fourth terminal; and
a third switch circuit including a second common terminal, a fifth terminal, and a sixth terminal,
wherein the first terminal is connected to the first common terminal, the second terminal is connected to the second common terminal, the third terminal is connected to the first transmit filter, and the fifth terminal is connected to the second transmit filter,
wherein the first switch circuit includes first switches disposed one each in series between the first antenna connection terminal and the first terminal, between the first antenna connection terminal and the second terminal, between the second antenna connection terminal and the first terminal, and between the second antenna connection terminal and the second terminal,
the second switch circuit includes second switches disposed one each in series between the first common terminal and the third terminal and between the first common terminal and the fourth terminal, and
the third switch circuit includes third switches disposed one each in series between the second common terminal and the fifth terminal and between the second common terminal and the sixth terminal, and
wherein each of the second switches has a smaller stack number than each of the first switches, and each of the third switches has a smaller stack number than each of the first switches.

2. The radio frequency circuit according to claim 1, wherein the first switch circuit includes fourth switches connected one each between the first antenna connection terminal and ground, between the second antenna connection terminal and ground, between the first terminal and ground, and between the second terminal and ground,
the second switch circuit includes fifth switches connected one each between the first common terminal and ground, between the third terminal and ground, and between the fourth terminal and ground, and
the third switch circuit includes sixth switches connected one each between the second common terminal and ground, between the fifth terminal and ground, and between the sixth terminal and ground.

3. The radio frequency circuit according to claim 2, wherein the first switch circuit is configured to switch between a state in which electrical continuity is provided between the first terminal and the first antenna connection terminal and a state in which electrical continuity is provided between the first terminal and the second antenna connection terminal and switch between a state in which electrical continuity is provided between the second terminal and the first antenna connection terminal and a state in which electrical continuity is provided between the second terminal and the second antenna connection terminal,
wherein the second switch circuit is configured to switch between a state in which electrical continuity is provided between the first common terminal and the third terminal and a state in which electrical continuity is provided between the first common terminal and the fourth terminal, and
wherein the third switch circuit is configured to switch between a state in which electrical continuity is provided between the second common terminal and the fifth terminal and a state in which electrical continuity is provided between the second common terminal and the sixth terminal.

4. The radio frequency circuit according to claim 3, further comprising:
a first matching circuit connected between the first switch circuit and the second switch circuit; and
a second matching circuit connected between the first switch circuit and the third switch circuit,
wherein the first matching circuit and the second matching circuit each include an inductor.

5. The radio frequency circuit according to claim 3, further comprising:
a first filter circuit connected between the first switch circuit and the second switch circuit; and
a second filter circuit connected between the first switch circuit and the third switch circuit,
wherein the first filter circuit is a low pass filter or a band pass filter, and the second filter circuit is a low pass filter or a band pass filter.

6. The radio frequency circuit according to claim 5, a frequency range of intermodulation distortion at least partially overlaps the second frequency band, the intermodulation distortion being caused by a fundamental wave of a transmit signal in the first transmit band and a second harmonic wave of a transmit signal in the second transmit band.

7. The radio frequency circuit according to claim 5, wherein a frequency range of intermodulation distortion at least partially overlaps the second frequency band, the intermodulation distortion being caused by a fundamental wave of a transmit signal in the first transmit band and a second harmonic wave of a transmit signal in the second transmit band.

8. A communication device comprising:
the radio frequency circuit according to claim 2; and
an RF signal processing circuit configured to process a radio frequency signal that is transmitted or received by the radio frequency circuit.

9. The radio frequency circuit according to claim 1, wherein the first switch circuit is configured to switch between a state in which electrical continuity is provided between the first terminal and the first antenna connection terminal and a state in which electrical continuity is provided between the first terminal and the second antenna connection terminal and switch between a state in which electrical continuity is provided between the second terminal and the first antenna connection terminal and a state in which electrical continuity is provided between the second terminal and the second antenna connection terminal,
wherein the second switch circuit is configured to switch between a state in which electrical continuity is provided between the first common terminal and the third terminal and a state in which electrical continuity is provided between the first common terminal and the fourth terminal, and
wherein the third switch circuit is configured to switch between a state in which electrical continuity is provided between the second common terminal and the fifth terminal and a state in which electrical continuity is provided between the second common terminal and the sixth terminal.

10. A communication device comprising:
the radio frequency circuit according to claim 9; and
an RF signal processing circuit configured to process a radio frequency signal that is transmitted or received by the radio frequency circuit.

11. The radio frequency circuit according to claim 1, further comprising:
a first matching circuit connected between the first switch circuit and the second switch circuit; and
a second matching circuit connected between the first switch circuit and the third switch circuit,
wherein the first matching circuit and the second matching circuit each include an inductor.

12. The radio frequency circuit according to claim 1, further comprising:
a first filter circuit connected between the first switch circuit and the second switch circuit; and
a second filter circuit connected between the first switch circuit and the third switch circuit,
wherein the first filter circuit is a low pass filter or a band pass filter, and
the second filter circuit is a low pass filter or a band pass filter.

13. The radio frequency circuit according to claim 12, wherein a frequency range of intermodulation distortion at least partially overlaps the first frequency band, the intermodulation distortion being caused by a second harmonic wave of a transmit signal in the first transmit band and a fundamental wave of a transmit signal in the second transmit band.

14. The radio frequency circuit according to claim 13, wherein the first frequency band is Band 3 for LTE standard or 5G NR standard, and
the second frequency band is Band 1 for LTE standard or 5G NR standard.

15. The radio frequency circuit according to claim 13, wherein the first frequency band is Band 40 for LTE standard or 5G NR standard, and
the second frequency band is Band 1 for LTE standard or 5G NR standard.

16. The radio frequency circuit according to claim 12, wherein a frequency range of intermodulation distortion at least partially overlaps the second frequency band, the intermodulation distortion being caused by a fundamental wave of a transmit signal in the first transmit band and a second harmonic wave of a transmit signal in the second transmit band.

17. The radio frequency circuit according to claim 16, wherein the first frequency band is Band 3 for LTE standard or 5G NR standard, and
the second frequency band is Band 1 for LTE standard or 5G NR standard.

18. The radio frequency circuit according to claim 16, wherein the first frequency band is Band 40 for LTE standard or 5G NR standard, and
the second frequency band is Band 1 for LTE standard or 5G NR standard.

19. The radio frequency circuit according to claim 1, further comprising:
a fourth transmit filter that is connected to the first power amplifier and that has a pass band including a fourth transmit band, the fourth transmit band being included in a fourth frequency band that matches neither the first frequency band nor the second frequency band; and
a third transmit filter that is connected to the second power amplifier and that has a pass band including a third transmit band, the third transmit band being included in a third frequency band that matches neither the first frequency band, the second frequency band, nor the fourth frequency band,
wherein the fourth terminal is connected to the fourth transmit filter, the sixth terminal is connected to the third transmit filter,
wherein neither a transmit filter having a pass band including the second transmit band nor a transmit filter having a pass band including the third transmit band is disposed between the first power amplifier and the second switch circuit, and
neither a transmit filter having a pass band including the first transmit band nor a transmit filter having a pass band including the fourth transmit band is disposed between the second power amplifier and the third switch circuit, and
wherein two-uplink transmission of sending a transmit signal in the first transmit band and a transmit signal in the second transmit band is performed through electrical continuity between the first common terminal and the third terminal and electrical continuity between the second common terminal and the fifth terminal, and two-uplink transmission of sending a transmit signal in the third transmit band and a transmit signal in the fourth transmit band is performed through electrical continuity between the first common terminal and the fourth terminal and electrical continuity between the second common terminal and the sixth terminal.

20. A communication device comprising:

the radio frequency circuit according to claim 1; and an RF signal processing circuit configured to process a radio frequency signal that is transmitted or received by the radio frequency circuit.

\* \* \* \* \*